(12) United States Patent
Moy et al.

(10) Patent No.: US 6,583,419 B1
(45) Date of Patent: Jun. 24, 2003

(54) SOLID STATE RADIATION DETECTOR WITH ENHANCED LIFE DURATION

(75) Inventors: Jean-Pierre Moy, Saint Egreve (FR); Gérard Vieux, Froges (FR); Didier Monin, St. Etienne de Crossey (FR); Odile Feron, Champagnier (FR)

(73) Assignee: Trixell S.A.S., Moirans (FR)

(*) Notice: Subject to any disclaimer, the term of this patent is extended or adjusted under 35 U.S.C. 154(b) by 0 days.

(21) Appl. No.: 09/762,704

(22) PCT Filed: Jul. 23, 1999

(86) PCT No.: PCT/FR99/01817

§ 371 (c)(1),
(2), (4) Date: Feb. 12, 2001

(87) PCT Pub. No.: WO00/10194

PCT Pub. Date: Feb. 24, 2000

(30) Foreign Application Priority Data

Aug. 11, 1998 (FR) .............................. 98 10305

(51) Int. Cl.$^7$ ............................................. G01T 1/20
(52) U.S. Cl. ........................... 250/370.11; 250/370.01; 257/433
(58) Field of Search .................. 250/370.11, 370.01, 250/208.1; 257/433; 438/116

(56) References Cited

U.S. PATENT DOCUMENTS

| | | | |
|---|---|---|---|
| 3,883,214 A | * | 5/1975 | Hoffman ..................... 117/33.3 |
| 4,682,018 A | | 7/1987 | Moy |
| 4,743,751 A | | 5/1988 | Arques et al. |
| 4,783,594 A | * | 11/1988 | Schulte et al. ......... 250/370.08 |
| 4,803,366 A | | 2/1989 | Vieux et al. |
| 4,862,006 A | | 8/1989 | Vieux et al. |
| 4,943,254 A | | 7/1990 | Vieux et al. |
| 4,960,608 A | | 10/1990 | Vieux et al. |
| 4,980,561 A | | 12/1990 | Vieux et al. |
| 4,985,633 A | | 1/1991 | Vieux et al. |
| 5,131,876 A | | 7/1992 | Vieux et al. |
| 5,187,369 A | | 2/1993 | Kingsley et al. |
| 5,256,870 A | | 10/1993 | Raverdy et al. |
| 5,288,989 A | * | 2/1994 | Ishaque et al. .......... 250/214.1 |
| 5,298,294 A | | 3/1994 | Vieux et al. |
| 5,449,449 A | | 9/1995 | Vieux et al. |
| 5,463,225 A | * | 10/1995 | Kwasnick et al. ..... 250/370.11 |
| 5,506,409 A | * | 4/1996 | Yoshida et al. ............. 250/368 |
| 5,516,388 A | * | 5/1996 | Moran et al. .................. 156/89 |
| 5,665,850 A | * | 9/1997 | Priou .......................... 528/31 |
| 5,770,301 A | * | 6/1998 | Murai et al. ................ 428/213 |
| 5,825,078 A | * | 10/1998 | Michael ...................... 257/632 |
| 5,929,441 A | * | 7/1999 | Beratan et al. .......... 250/338.3 |
| 5,973,327 A | | 10/1999 | Moy et al. |
| 5,998,303 A | * | 12/1999 | Sato ........................... 438/758 |
| 6,348,693 B1 | * | 2/2002 | Weisfield et al. ...... 230/370.11 |

FOREIGN PATENT DOCUMENTS

| | | | |
|---|---|---|---|
| EP | 0 528 676 | 2/1993 | |
| EP | 0 637 084 | 2/1995 | |
| FR | 2 758 654 | 7/1998 | |
| FR | 2778021 | * 10/1999 | ......... H01L/27/146 |

* cited by examiner

Primary Examiner—Constantine Hannaher
Assistant Examiner—Timothy Moran
(74) Attorney, Agent, or Firm—Oblon, Spivak, McClelland, Maier & Neustadt, P.C.

(57) ABSTRACT

A solid state photosensitive detector including a solid state photosensitive sensor associated with a converter designed to convert radiation to be detected into radiation to which the photosensitive sensor is sensitive. The photosensitive sensor includes one or more photosensitive elements connected to conductors and a passivation layer covering the photosensitive elements and the conductors to protect them. Between the passivation layer and the converter, a barrier is provided that is impermeable to at least one chemical species that is corrosive for the sensor, capable of being released by the converter during at least one chemical reaction. Such a detector may find particular application to radiation detectors for medical radiology.

24 Claims, 2 Drawing Sheets

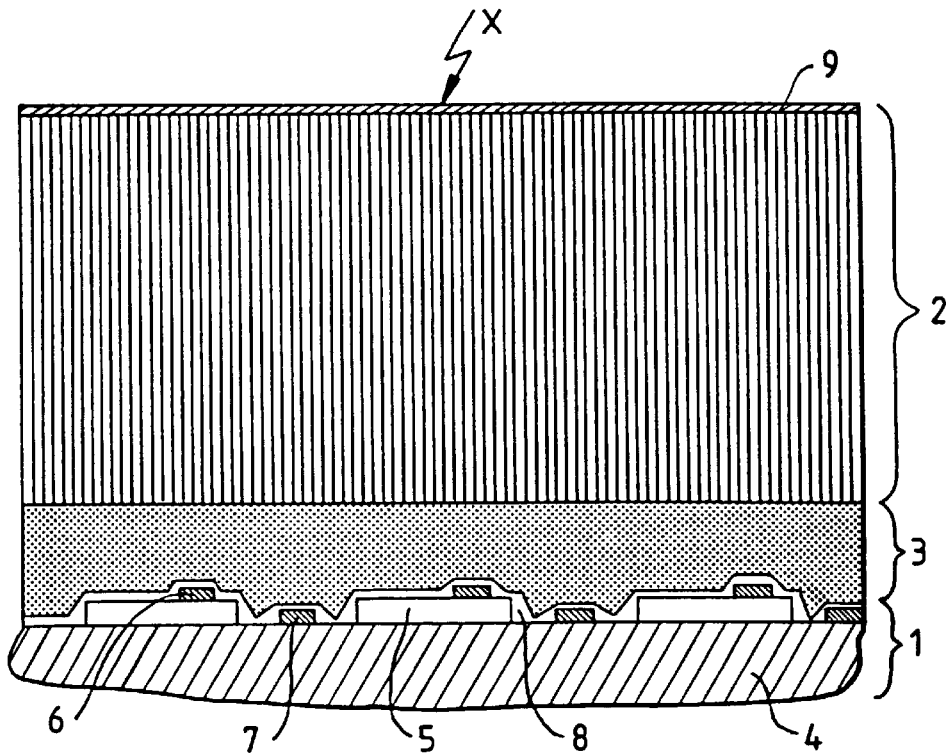
PRIOR ART  FIG.1
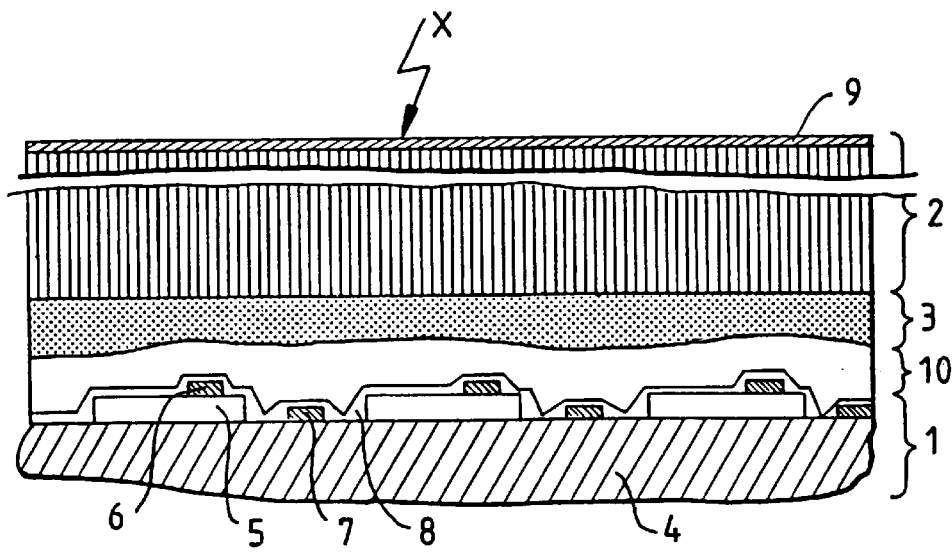
FIG.2

SOLID STATE RADIATION DETECTOR WITH ENHANCED LIFE DURATION

The present invention relates to solid state radiation detectors of the type comprising a photosensitive sensor formed by a plurality of solid state photosensitive elements associated with a radiation converter. The converter converts the radiation that it receives so that it can be exploited by the sensor. The field of use of this type of detector is especially that of medical radiology.

BACKGROUND OF THE INVENTION

Solid state photosensitive sensors do not react to very short wavelengths such as X-rays for example. In this application, the radiation converter is a scintillator screen that is made out of a substance having the property, when excited by X-rays, of emitting in a range of wavelengths that are greater, namely wavelengths in the visible and near range.

The visible light thus generated is transmitted to the photosensitive elements of the sensor which carry out a photoelectrical conversion of received light energy into electrical signals that can be exploited by appropriate electronic circuits.

In other applications, the converter may be a fluorescent screen and may convert visible radiation into other forms of visible radiation or convert near visible radiation into visible radiation.

The converter can thus for example convert ultraviolet radiation into a visible radiation to which the photosensitive elements of the sensor are sensitive. Other converters receive an infrared radiation which they convert into visible radiation.

The photosensitive elements are made out of semiconductor materials usually crystalline or amorphous silicon. A photosensitive element comprises at least one photodiode, one phototransistor or one photoresistor. This photosensitive element is mounted between a column conductor and a row conductor in order to be addressed. Conductors and the photosensitive elements are deposited on an insulating substrate preferably made of glass.

The assembly is covered, in a way that is standard in the semiconductor field, with a passivation layer that is designed especially to protect the sensor from moisture. This layer is generally made of silicon nitride or silicon oxide.

The example taken is that of the field of X-ray imaging with a scintillator screen as converter. Depending on the application planned, various compositions of scintillating substances are used such as, for example, terbium-doped gadolinium oxysulfide ($Gd_2O_2S$:Tb) or again thallium-doped cesium iodide (CsI:Tl).

Crystalline silicon can be obtained only in relatively small dimensions of surface area. It is used to make photosensitive sensors of the charge-coupled device (CCD) type. These CCD type photosensitive sensors are especially used in dental imaging and in mammography.

Hydrogenated amorphous silicon can be used to make larger-sized photosensitive sensors (of up to 50 cm×50 cm for example). It is generally used, by means of thin-film deposition techniques, to constitute matrices of photodiodes or phototransistors. Variable-sized detection matrices can be applied in all the fields of conventional radiology.

Radiation detectors of this kind using the association of a scintillator screen and of a photosensitive sensor made of semiconductor material are well known, for example from the following documents: J. Chabbal et al., "Amorphous Silicon X-Ray Image Sensor", in the journal SPIE 2708, pages 499–510, 1996; L. E. Antonuk et al., "Development of a High Resolution, Active Matrix, Flat Panel Imager with Enhanced Fill Factor", in the journal SPIE 3032, pages 2–13, 1997; and the U.S. Pat. No. 5,276,329.

Reference may also be made to the French patent application FR-2 605 166 which describes a radiation detector structure using a scintillator screen and a matrix of photodiodes made of amorphous silicon, as well as the working of the radiation detector.

The converter can be deposited directly on the photosensitive sensor. However, the common practice is to make the converter and the photosensitive sensor separately and to couple them by means of a layer of transparent bonder. This is especially the case when the converter is of the "intensifier screen" type made of $Gd_2O_2S$:Tb for example. However this is also a configuration that can be applied to the case of scintillator screens of the type obtained by evaporation, such as thallium-doped cesium iodide scintillators $C_sI$:Tl which sometimes need to be prepared separately in order so that they can be subjected to the thermal and chemical processes that are incompatible with the photosensitive sensor.

The commonly used bonders are chosen for their properties of adhesion as well as for their flexibility and optical properties. They must withstand mechanical stresses for the radiation detector must be able to withstand mechanical stresses in the form of vibrations and shocks. They must also be transparent to the light produced by the converter.

When the converter is made separately, it is often deposited on a support such as for example an aluminium alloy foil which then forms an input window for the radiation to be detected. These aluminum alloys combine the requisite qualities which are low absorption of incident radiation to be detected for a thickness that gives the foil used sufficient rigidity that is compatible with handling. The sizes of the foils are about 50 cm×50 cm in the field of general radiology. An absorption of about 1% for a support with a thickness of 100 micrometers exposed to a standard spectrum according to the American standard RQA5 is satisfactory.

The support should be capable of withstanding the temperatures used for the deposition and annealing of the detector. For cesium iodide, this temperature is about 300° C. It must be moisture-proof and should be of reasonable cost.

In this configuration, with an electrically conductive support for the converter, there is the capacitive coupling between photosensitive elements if the support is left at a floating potential. This prompts a phenomenon of smearing between photosensitive elements. The signals produced by the highly illuminated photosensitive elements are transmitted to the neighboring photosensitive elements which are not illuminated or hardly illuminated. The result thereof is a loss of contrast at a great distance. It therefore becomes necessary to make the potential of the conductive support fixed for example by giving it a ground connection or taking it to another more appropriate voltage.

It has been noted in certain cases that this detector configuration has a short lifetime.

It is desirable that such radiation detectors should have a lifetime compatible with the period of depreciation of the radiological or other instruments on which they are is mounted, this period being close to about ten years. The radiation detector represents a substantial part of the cost of the machine and it would be better not to have to replace it.

The aim of the invention therefore is to increase the lifetime of solid state radiation detectors.

BRIEF SUMMARY OF THE INVENTION

The inventors, having examined solid state radiation detectors that are out of use, have observed the fact that the conductors and/or the photosensitive elements of the sensors are corroded.

Further investigation has led them to the conclusion that the material of the converter gets partially decomposed in the ambient air and/or under moisture, and produce chemical species that are corrosive for the photosensitive sensor. These species migrate, especially under the effect of the electrical field between the conductors and the support of the sensor, towards the photosensitive elements and the conductors, and they do so despite the passivation layer.

To improve the lifetime of radiation detectors of this kind, the present invention therefore proposes the placing, between the converter and the photosensitive sensor, of a barrier of material impermeable to at least one corrosive chemical species for the sensor and capable of being released during at least one chemical reaction in the converter.

More specifically, the radiation detector according to the invention has a Solid state photosensitive detector comprising a solid-state photosensitive sensor combined with a converter intended to convert a radiation to be detected into a radiation to which the photosensitive sensor is sensitive, the photosensitive sensor comprising one or more photosensitive elements linked to conductors and a passivation layer covering the photosensitive elements and the conductors in order to protect them, characterized in that it comprises, between the passivation layer and the converter, a barrier impermeable to at least one chemical species that is corrosive for the sensor, capable of being released by the converteur during at least one chemical reaction.

The reaction that is likely to occur is a reaction of oxidation and/or a reaction of hydrolysis and/or a reaction of electrolysis.

Preferably, the barrier is chosen to be hydrophobic so as not to accentuate the phenomena of degradation and migration and so not to corrode the sensor if it is deposited directly on it.

The barrier has a refraction index as close as possible to that of the passivation layer.

It is ensured that the barrier closely fits the surface on which it is deposited especially if this surface has raised features.

If the barrier has a sufficiently flat foundation, it may have a chemically inert protection layer on the surface, based for example on fluoride.

The barrier may be made of a resin base such as acrylic resin, polyimide resin, or a resin that is a derivative of benzo-cyclo-butene.

It is also possible to choose a bi-constituent silicone elastomer containing as little solvent as possible after polymerization.

The barrier can also be made out of polyparaxylene or one of its halogen derivatives such as polytetrafluoroparaxylene.

It is also possible to choose a tropicalizing varnish, a sol-gel with at least one mineral constituent such as silica.

The barrier may be made out of a solution based on soluble silicate or at least one bonded polyester membrane.

Diamond carbon deposited in chemical vapor phase also gives good results.

To further increase the protection, it is preferable that the barrier should be formed by a stack of layers.

BRIEF DESCRIPTION OF THE SEVERAL VIEWS OF THE DRAWINGS

The invention will be understood more clearly and other features and advantages shall appear from the following description of exemplary solid state radiation detectors with reference to the appended figures, of which:

FIG. 1 shows a sectional view of a standard radiation detector that can be used to explain the phenomena of destruction of the solid state photosensitive sensor;

FIG. 2 shows a sectional view of a radiation detector according to the invention in which the photosensitive sensor and the radiation converter are assembled by bonding;

DETAILED DESCRIPTION OF THE INVENTION

Figure 3:
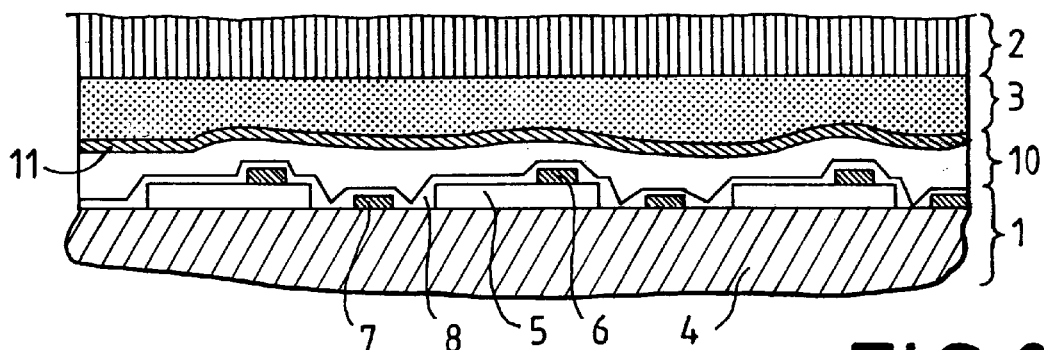
FIG. 3 shows a sectional view of a radiation detector according to the invention with an additional protection layer.

In these figures, the same elements bear the same references.

Referring to FIG. 1, a standard solid state sensor comprises a solid state photosensitive sensor 1 associated with a converter 2. In the example, the sensor 1 and the converter 2 are fixed to each other by means of bonder 3 which also sets up an optical coupling.

The solid state photosensitive sensor 1 has photosensitive elements 5 on an insulating substrate 4 generally made of glass. These photosensitive elements 5 are generally formed by photodiodes, phototransistors or photoresistors connected firstly to column conductors 6 and secondly to row conductors 7. In FIG. 1, the connection between the row conductor 7 and the photosensitive element 5 cannot be seen because it is made at a place which is not in the sectional plane.

The photosensitive elements 5 and their column conductors 6 and row conductors 7 are covered with one and the same passivation layer 8 which protects them especially from moisture. The photosensitive elements made of amorphous silicon are highly sensitive to moisture which increases the leakage currents.

In the example shown, it is assumed that the radiation detector is a radiological image detector and that it is designed to be exposed to X-rays.

The converter 2 is then a scintillator screen, for example made of rare-earths oxysulfide or cesium iodide. It is assumed that it has been deposited on a conductive support 9.

As already stated, the inventors have observed that such converters 2 inevitably deteriorate in air and/or under moisture.

The ill effects of ambient air are difficult to eliminate. As for moisture, the bonder used often contains traces of it either because of the ambient air or because of the process of polymerization in the case of polymer bonders.

If the scintillator screen is made of rare-earths oxysulfide, the decomposition is a hydrolysis, and hydrogen sulfide, which is highly aggressive, is released. For example, the reaction with lanthanum oxysulfide is as follows:

$$La_2O_2S+H_2O \rightarrow La_2O_3+H_2S$$

If the scintillator screen is cesium iodide, its decomposition gives cesium hydroxide $Cs^+OH^-$ and free iodine $I_2'$ which can then get combined with iodide ions to form the $I_3^-$ complex. The reaction is as follows:

$$2CsI+1/2O_2+H_2O \rightarrow 2Cs^+OH^- +I_2$$

$$I_2+I^-+1/2O_2+H_2O \rightarrow I_3^- +2OH^-$$

The inventors have observed that the passivation layer 8 almost inevitably has defects such as cracks especially in the steps between the photosensitive elements 5 and the column electrodes 6, between the row electrodes 7 and the substrate 4. The chemical species thus released will corrode the passivation layer 8 at these defects and then reach the photosensitive elements 5 and the conductors 6, 7 which they destroy.

If the converter 2 has been deposited on a conductive support 9 and if, during operation, this support 9 is taken to a fixed potential $V_s$ below the potential $V_L$ of the row conductors 7 and/or the potential $V_c$ of the column conductors 6, the corrosion occurs at far higher speed.

Indeed, a variable electrical field appears in the converter 2 and a phenomenon of electrolysis is initiated if humidity is present. The negative ions, for example $OH^-$, $I^-$, $I_3^-$ released during the decomposition of the scintillator screen migrate very speedily to the photosensitive sensor 1. They attack the passivation layer 8 and then dissolve the photosensitive elements 5 and the conductors 6, 7.

As for the positive ions $Cs^+$, they migrate quickly to the support 9 and cause an increase of the pH factor that could cause it to be perforated.

If the potential $V_s$ is greater than the potential $V_L$ or the potential $V_c$, the migration of the ions takes place in the reverse direction but the corrosion exists all the same.

FIG. 2 shows the same type of radiation detector as in FIG. 1 but, in accordance with the invention, it is provided with a barrier 10 impermeable to at least one chemical species released during at least one chemical reaction likely to occur in the converter 2. This barrier 10 is located between the passivation layer 8 of the sensor 1 and the converter 2. The reaction may be a reaction of oxidation and/or hydrolysis and/or electrolysis.

In the example, the converter 2 and the sensor 1 are assembled by bonding. The layer of bonder is referenced 3. The barrier 10 is between the passivation layer 8 of the sensor 1 and the layer 3 of bonder.

Figure 4:
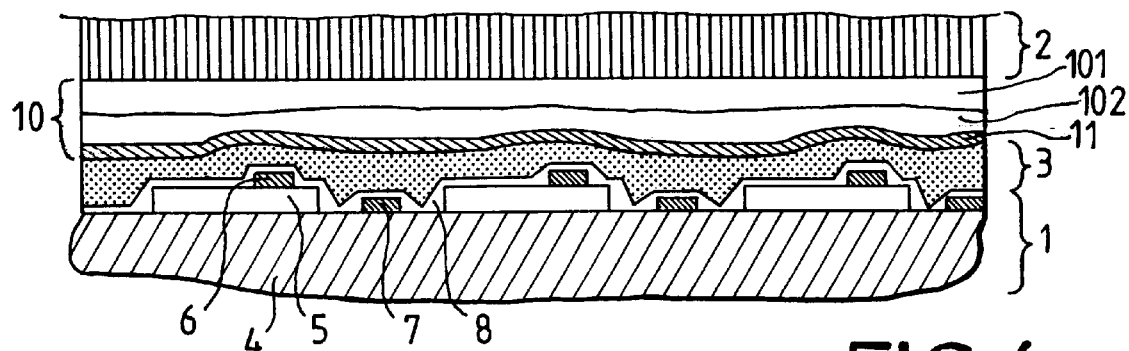
FIG. 4 shows a sectional view of an alternative embodiment of a radiation detector according to the invention in which the photosensitive sensor and the radiation converter are assembled by bonding.

The reverse is possible as shown in FIG. 4, where the barrier 10 is between the converter 2 and the layer 3 of bonder.

The barrier 10, in addition to its impermeability to the corrosive chemical species coming from the converter 2, will preferably have high transparency to the light produced by the converter 2. Its index of refraction will be as close as possible to that of the passivation layer 8 which is about 1.8 if it is silicon nitride. The barrier 10, when it is deposited directly on the photosensitive sensor 1, is chosen to be inert with respect to the sensor. In the example described, if it is an amorphous silicon sensor, the barrier 10 will be particularly hydrophobic.

The barrier 10 will be made out of materials whose preparation is compatible with the technology of the photosensitive sensor. If this photosensitive sensor is made of amorphous silicon, the barrier 10 should not release any solvents. Nor should it get electrically charged.

To form a reliable obstacle to the chemical species released, it is desirable that the barrier 10 should be particularly well-fitted to the surface on which it is deposited, i.e. it should cover all its raised features. Here, it is deposited on the passivation layer 8 and should cover the flanks of the steps formed by the photosensitive elements 5, the column conductors 6 and the row conductors 7.

To prevent capacitive coupling between different photosensitive elements 5, the barrier 10 is given high resistivity, for example resistivity of over $10^6$ ohms per unit of surface area.

In a standard way, the edge of the photosensitive sensor 1 has contacts (notshown) at the ends of the row conductors 7 and column conductors 6 so that they can be addressed. The barrier 10 has to be made out of materials compatible with the making of the contacts. For example, it should be capable of being deposited by mask or should be capable of being etched.

Appropriate materials are for example resins such as acrylic resins, polyimide resins, resins derived from benzo-cyclo-butene (BCB). Resins such as this can be deposited by plate-coating, silk-screen printing, roller-coating or spraying.

It is also appropriate to use bi-component silicone elastomers containing, after polymerization, as low a solvent content as possible. They are deposited in thin layers. Those that take the form of gel cannot be employed for they have low reticulation and have a large number of gaps furthering the migration of chemical species.

One category of material that is very useful is polyparaxylene or its halogen derivatives such as polytetrafluoroparaxylene. These materials can be deposited in vapor phase and give particularly satisfactory results with regard to the covering of the raised features.

It is also possible to use tropicalizing varnishes which are highly hydrophobic.

Mineral constituents in sol-gel, form especially silica constituents, can also be used. They are deposited by dip-coating and then oven dried. The layer obtained has particularly low porosity.

Approaches based on soluble silicates, known as "liquid glasses", can also be used. They can be deposited by spraying and then annealing.

It is also possible to make use of at least one polyester membrane that is bonded. A material such as this is particularly impermeable, but the bonding is fairly difficult because it is necessary to avoid bubbles. As for the optical properties, they are not always optimal.

Diamond carbon deposited by chemical vapor deposition (CVD) is also particularly useful because it covers the raised features well.

The list of possible materials is not exhaustive.

It is preferable for the barrier 10 to be formed by a stack of several layers 101, 102 so as to obtain almost total impermeability. Indeed, by stacking several layers, it is unlikely that the defects of the layers 101, 102, if any, will coincide.

To further increase the protection of the photosensitive sensor 1, it is possible that the barrier 10 will furthermore comprise a protection layer 11 on the surface, made of a material that is particularly inert chemically if the barrier 10 has a foundation 100 that is sufficiently plane. The foundation 100 of the barrier 10 of FIG. 4 corresponds to the layers 101, 102.

A protection layer 11 of this type can be fluoride based. For example, it may be magnesium fluoride $MgF_2$. The deposition can be done under vacuum according to a common technique in optical processing.

A protection layer 11 of this kind, which is vacuum-deposited, requires a relatively plane base of deposition because there is a shadow phenomenon with vacuum deposition. If the deposition base has overhanging raised features, the zones located under the overhanging features will not be covered. On a flat surface, the covering is practically faultless.

In FIG. 3, the barrier 10 has a protective layer 11. Paraxylene and resins derived from benzo-cyclo-butene give a degree of planeity that is quite appreciable.

In FIG. 4, the barrier 10 has been deposited directly on the converter 3. It is between the converter 2 and the bonder 3. It has two layers 101, 102 stacked one on top of the other and a surface protection layer 11. The bonder 3 is between the passivation layer 8 of the sensor 1 and the barrier 10. The protection layer 11 on the surface of the barrier 10 is therefore on the bonder 3 side.

Figure 5:
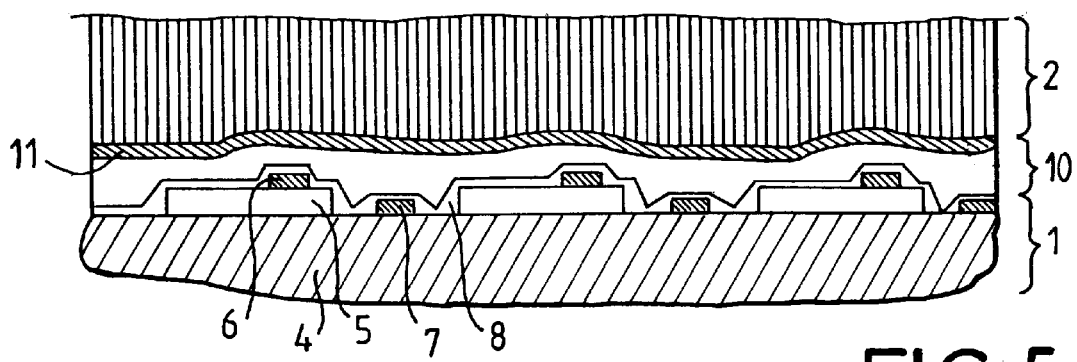
FIG. 5 shows a sectional view of a radiation detector according to the invention without a layer of bonder for assembling the sensor with the converter.

The last example shown in FIG. 5 illustrates the configuration where there is no bonder. The converter 2 is deposited by direct vapor deposition on the barrier 10 which is also in contact with the sensor 1. The barrier 10 has been shown in its configuration with a protection layer 11, which is on the converter 2 side. In this configuration, the barrier 10 has to withstand the temperature of deposition of the converter 2 which is about 300° C. for cesium iodide for example. In this configuration, it will be inert with respect to the sensor 1.

What is claimed is:

1. Solid-state radiation detector comprising:
   a solid-state photosensitive sensor combined with a converter to convert radiation to be detected into radiation to which the photosensitive sensor is sensitive, the photosensitive sensor comprising one or more photosensitive elements linked to conductors and a passivation layer covering the photosensitive elements and the conductors in order to protect them;
   a barrier, positioned between the passivation layer and the converter, impermeable to at least one chemical species corrosive for the sensor and released by a decomposition process of the converter, the barrier is comprised of a material other than polyimide.

2. Radiation detector according to claim 1, wherein the decomposition is a reaction of oxidation and/or a reaction of hydrolysis and/or a reaction of electrolysis.

3. Radiation detector according to claim 1, wherein the converter is joined to the sensor by adhesive bonding, the barrier lying either on the same side as the converter with respect to the adhesive or on the same side as the sensor.

4. Radiation detector according to claim 1, wherein the converter is deposited on the barrier by evaporation.

5. Radiation detector according to claim 1, wherein the barrier is inert with respect to the sensor when the barrier is in direct contact with the sensor.

6. Radiation detector according to claim 1, wherein the barrier has a refraction index as close as possible to that of the passivation layer.

7. Radiation detector according to claim 1, wherein the barrier is hydrophobic.

8. Radiation detector according to claim 1, wherein the barrier substantially conforms to contours of a surface on which it is deposited.

9. Radiation detector according to claim 1, wherein the barrier is formed from a stack of layers.

10. Radiation detector according to claim 9, wherein the barrier has a substantially flat foundation and includes, on a surface, a chemically inert protective layer.

11. Radiation detector according to claim 10, wherein the protective layer is based on a fluoride such as magnesium fluoride.

12. Radiation detector according to claim 1, wherein the barrier has a high electrical resistivity, greater than about $10^6$ ohms per square.

13. Radiation detector according to claim 1, wherein the barrier is comprised of an acrylic resin.

14. Radiation detector of claim 13, wherein the barrier is formed of a resin derived from benzocyclobutene.

15. Radiation detector according to claim 1, wherein the barrier is comprised of a bi-constituent silicone elastomer.

16. Radiation detector according to claim 1, wherein the barrier is comprised of polyparaxylene.

17. Radiation detector according to claim 16, wherein the barrier is a halogenated derivative of polyparaxylene.

18. Radiation detector according to claim 17, wherein the halogenated derivative of polyparaxylene is polytetrafluoroparaxylene.

19. Radiation detector according to claim 1, wherein the barrier is made out of a tropicalizing varnish.

20. Radiation detector according to claim 1, wherein the barrier is comprised of a sol-gel of at least one mineral compound.

21. Radiation detector of claim 20, wherein the mineral compound is silica.

22. Radiation detector according to claim 1, wherein the barrier is made from a soluble silicate-based solution.

23. Radiation detector according to claim 1, wherein the barrier is made from at least one adhesively bonded polyester membrane.

24. Radiation detector according to claim 1, wherein the barrier is made out of vapour-deposited diamond-like carbon.

* * * * *